US012705219B2

(12) United States Patent
Mishra et al.

(10) Patent No.: US 12,705,219 B2
(45) Date of Patent: Aug. 11, 2026

(54) EVALUATING THE PERFORMANCE OF A LARGE LANGUAGE MODEL

(71) Applicant: Palo Alto Networks, Inc., Santa Clara, CA (US)

(72) Inventors: Spandan Mishra, Oakland, CA (US); Danielle Hyunwon Sim, Los Angeles, CA (US); Alexander Michael Margaris, Dublin, CA (US); Nandan Gautam Thor, Redwood City, CA (US); Alan Wayne Gilchrest, Zephyr Cove, NV (US)

(73) Assignee: Palo Alto Networks, Inc., Santa Clara, CA (US)

( * ) Notice: Subject to any disclaimer, the term of this patent is extended or adjusted under 35 U.S.C. 154(b) by 0 days.

(21) Appl. No.: 18/913,701

(22) Filed: Oct. 11, 2024

(65) Prior Publication Data

US 2026/0105034 A1 Apr. 16, 2026

(51) Int. Cl.

| | |
|---|---|
| ***G06F 16/20*** | (2019.01) |
| ***G06F 16/215*** | (2019.01) |
| ***G06F 16/334*** | (2025.01) |
| ***G06F 30/27*** | (2020.01) |
| ***G06F 40/284*** | (2020.01) |
| *G06F 16/2458* | (2019.01) |
| *G06F 17/18* | (2006.01) |
| *G06F 18/00* | (2023.01) |
| *G06F 18/21* | (2023.01) |
| *G06F 40/44* | (2020.01) |

(52) U.S. Cl.

CPC ........ *G06F 16/215* (2019.01); *G06F 16/3346* (2019.01); *G06F 30/27* (2020.01); *G06F 40/284* (2020.01); *G06F 16/2462* (2019.01); *G06F 16/3347* (2019.01); *G06F 17/18* (2013.01); *G06F 18/00* (2023.01); *G06F 18/217* (2023.01); *G06F 40/44* (2020.01)

(58) Field of Classification Search

CPC ............... G06F 16/215; G06F 16/2462; G06F 16/3346; G06F 16/3347; G06F 17/18; G06F 18/00; G06F 18/217; G06F 30/27; G06F 40/284; G06F 40/44

See application file for complete search history.

(56) References Cited

U.S. PATENT DOCUMENTS

2025/0053876 A1* 2/2025 Upadhyay .............. G06N 20/00
2025/0086235 A1* 3/2025 Kumar .............. G06F 16/90332
2025/0158830 A1* 5/2025 Buchanan ............. H04L 63/102
2025/0209281 A1* 6/2025 Mallick ............... G06F 16/3329
2025/0328565 A1* 10/2025 Larson ................ G06F 16/3344

* cited by examiner

*Primary Examiner* — Diedra McQuitery
(74) *Attorney, Agent, or Firm* — Van Pelt, Yi & James LLP

(57) ABSTRACT

A query is received. A performance of a large language model that generated a query response based on the received query is evaluated. Evaluating the performance of the large language model includes determining a reference dependent evaluator score and/or a reference free evaluator score. One or more documents used to generate the received query are requested to be updated based on the reference dependent evaluator score associated with the query response. The one or more updated documents are received and stored. The one or more updated documents are utilized by the large language model to generate one or more subsequent query responses for one or more subsequent queries.

20 Claims, 6 Drawing Sheets

EVALUATING THE PERFORMANCE OF A LARGE LANGUAGE MODEL

BACKGROUND OF THE INVENTION

A large language model (LLM) receives a query from a user. A retrieval-augmented generation (RAG) architecture associated with the LLM searches for and retrieves relevant information from one or more external/internal sources to answer the query. The LLM utilizes the relevant information to enhance its ability to generate a response to the query. Users are blindly trusting the LLM's response as true, regardless of the LLM's ability to generate accurate information.

An LLM may generate responses that range from poor to excellent in quality, but there is no established method to objectively measure its performance. Currently, LLMs are manually evaluated. Individuals may manually review large amounts of data, such as users submitting questions and how the LLM responds. They evaluate each query, using their own judgment to determine whether the LLM's response is correct, whether it makes sense, if the appropriate citation is being used, and if the necessary data is available to answer the question. This process requires extensive time and user resources, and may introduce the reviewer's subjective bias into the evaluation.

BRIEF DESCRIPTION OF THE DRA WINGS

Various embodiments of the invention are disclosed in the following detailed description and the accompanying drawings.

DETAILED DESCRIPTION

Figure 1:
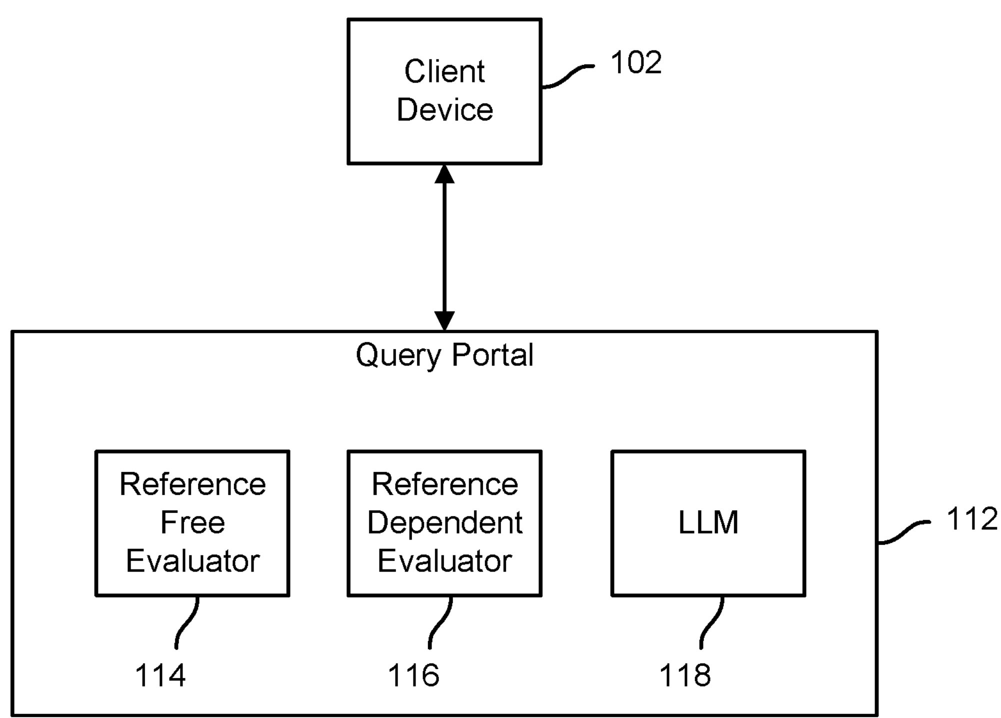
FIG. 1 is a block diagram illustrating a system to evaluate the performance of an LLM in accordance with some embodiments.

The invention can be implemented in numerous ways, including as a process; an apparatus; a system; a composition of matter; a computer program product embodied on a computer readable storage medium; and/or a processor, such as a processor configured to execute instructions stored on and/or provided by a memory coupled to the processor. In this specification, these implementations, or any other form that the invention may take, may be referred to as techniques. In general, the order of the steps of disclosed processes may be altered within the scope of the invention. Unless stated otherwise, a component such as a processor or a memory described as being configured to perform a task may be implemented as a general component that is temporarily configured to perform the task at a given time or a specific component that is manufactured to perform the task. As used herein, the term 'processor' refers to one or more devices, circuits, and/or processing cores configured to process data, such as computer program instructions.

A detailed description of one or more embodiments of the invention is provided below along with accompanying figures that illustrate the principles of the invention. The invention is described in connection with such embodiments, but the invention is not limited to any embodiment. The scope of the invention is limited only by the claims and the invention encompasses numerous alternatives, modifications and equivalents. Numerous specific details are set forth in the following description in order to provide a thorough understanding of the invention. These details are provided for the purpose of example and the invention may be practiced according to the claims without some or all of these specific details. For the purpose of clarity, technical material that is known in the technical fields related to the invention has not been described in detail so that the invention is not unnecessarily obscured.

Systems and methods to evaluate the performance of an LLM are disclosed herein. The systems and methods disclosed herein not only provide an objective evaluation of an LLM (i.e., remove human bias), but also reduce the time and resources required by a human to review the performance of an LLM. Instead of reviewing and evaluating all LLM responses, human evaluation is needed for only a quarter of the LLM responses, which is a 75% reduction in costs and resources associated with reviewing LLM responses.

The performance of an LLM can be divided into two aspects. The first aspect evaluates how well the LLM performs with the available data. The second aspect examines how effectively the LLM addresses the user's query. The latter is dependent on the former, as the LLM may not be able to accurately respond to user questions without access to high-quality data. Therefore, the quality of the LLM's responses is directly influenced by the quality of the input data.

The systems and methods disclosed herein seek to determine whether the LLM has access to quality input data for a received query. For some queries, the LLM has the necessary data to effectively respond to a user query. However, for other queries, the LLM may lack data needed to provide an effective answer. These knowledge gaps can be identified, and a request to update one or more documents used by the LLM to generate the LLM's response can be provided to an owner associated with the one or more documents. In response to receiving the one or more updated documents, the LLM can effectively answer one or more queries that previously could not be answered because the LLM has access to relevant information. As a result, the performance of the LLM is improved.

FIG. 1 is a block diagram illustrating a system to evaluate the performance of an LLM in accordance with some embodiments. In the example shown, system 100 includes client device 102 that is configured to provide a query to query portal 112. Client device 102 may be a computer, a laptop, a desktop, a server, a smartphone, a tablet, etc. Query portal 112 may be one or more servers, one or more virtual machines, one or more cloud servers, one or more containers, etc.

Query portal 112 is configured to provide the query to LLM 118. In some embodiments, LLM is a private LLM. In some embodiments, LLM is a public LLM. In some embodiments, LLM is a hybrid LLM.

In response to receiving the query, LLM 118 is configured to generate a query response and provide the query response to reference dependent evaluator 116. Reference dependent evaluator 116 is configured to generate a score for the query response. The reference dependent evaluator score (e.g., Bidirectional Encoder Representations from Transformers (BERT) score) is a reference dependent metric, meaning that measurement is taken with respect to a controlled variable or a baseline. These reference dependent metrics work by comparing the generated or retrieved information with the desired result. The reference dependent evaluator score indicates the ability of the LLM to effectively generate the query response.

The reference dependent evaluator score is an embedding-based approach where a token-by-token embedding of the retrieved context is compared with the token embedding of the user query.

The reference dependent evaluator score may be computed using the following formula:

$$\text{Reference Dependent Evaluator Score} = \frac{1}{|x|}\sum \max\left(xx^T\right)$$

where x is an embedding token vector and T is the vector's transpose.

In a first scenario, the reference dependent evaluator score is less than the first threshold. This indicates that the LLM may not have access to enough relevant data to properly answer the query.

In a second scenario, the reference dependent evaluator score is greater than or equal to the first threshold and less than or equal to a second threshold. This indicates that the query response may not be trustworthy and needs human review.

In a third scenario, the reference dependent evaluator score is greater than the second threshold. This indicates that the LLM response is trustworthy and likely has access to enough relevant data to properly answer the query.

The first threshold and second threshold may correspond a particular score percentile. For example, the first threshold may correspond to a median or a $50^{th}$ percentile score. The second threshold may correspond to a $75^{th}$ percentile score. In some embodiments, the first threshold and the second threshold correspond to a particular reference dependent evaluator score. For example, the first threshold may correspond to a reference dependent evaluator score of 0.84 and the second threshold may correspond to a reference dependent evaluator score of 0.88. In some embodiments, a combination of reference dependent evaluator scores and percentiles are used.

In the first scenario, the reference dependent evaluator score is reassigned to a value of 0. As a result, a resultant score for the LLM response is 0.

In the second and third scenarios, a prompt is provided to reference free evaluator 114 to evaluate the query response and generate a corresponding reference free evaluator score. Reference free evaluator 114 is a large language model. The prompt includes a definition of the task in hand and the evaluation criteria for the query response. The prompt includes a chain of thoughts that will instruct the large language model on how to grade the query response. The prompt includes a scoring function that calculates the score based on probabilities of returned tokens. The scoring function outputs a reference free evaluator score that is based on a coherence value, relevance value, a consistency value, and a fluency value.

The coherency value indicates the extent to which the query response is logically formulated. The prompt informs reference free evaluator 114 that the coherence score should have a score between a first value and a second value (e.g., 1 and 5). The coherence score is based on the collective quality of all sentences in the query response. The coherence dimension is aligned with the Document Understanding Conference (DUC) quality question of structure and coherence. The prompt informs reference free evaluator 114 that the query response should be well-structured and well-organized.

The relevance value indicates the extent to which the query response includes relevant information. The prompt informs reference free evaluator 114 that the relevance value should have a score between a first value and a second value (e.g., 1 and 5). The relevance score is based on whether the query response selects important content from the one or more source documents and the query response includes only important information from the one or more source documents. The prompt also informs reference free evaluator 114 that annotators were instructed to penalize summaries which contained redundancies and/or excess information.

The consistency value indicates the extent to which the LLM is able to provide the same or similar facts when asked repeatedly or in different ways about the same topic. The prompt informs reference free evaluator 114 that the consistency score should have a score between a first value and a second value (e.g., 1 and 5). The consistency score is based on a factual alignment between the query response and the one or more sources from which query response is based. The prompt indicates that a factually consistent summary contains only statements that are entailed by the source document and annotators were asked to penalize summaries that contained hallucinated facts. A hallucinated fact is a statement generated by the LLM model that may sound plausible, but is completely incorrect, unfounded, or fabricated. These hallucinated facts are not found in the training data or the one or more source documents that the LLM may have been asked to reference. Instead, they are invented by the LLM during the generation process.

The fluency value indicates the extent to which the LLM is able to generate the response that is grammatically correct, spells words correctly, uses correct punctuation, selects appropriate words and tone, and phrases the sentences in a clear manner. The prompt informs reference free evaluator 114 that the fluency value should have at least two different values. The at least two different values correspond to a qualitative value. For example, a fluency value of 1 may indicate a poor query response where the query response has many errors that make it hard to understand or sound unnatural. A fluency value of 2 may indicate a fair query response where the query response has some errors that affect the clarity or smoothness of the text, but the main points are still comprehensible. A fluency value of 3 may indicate a good query response where the query response has few or no errors and is easy to read and follow.

Reference free evaluator 114 is configured to run a Montecarlo simulation by repeating the process N times (e.g., repeating the query) and a corresponding average value is determined for relevance, coherence, consistency, and fluency. Weights associated with each of the average value are determined using the equation (sigmoid function):

$$\text{Weight} = \frac{\text{Max Weight}}{1 + \exp^{-2(score-threshold)}}$$

Figure 4:
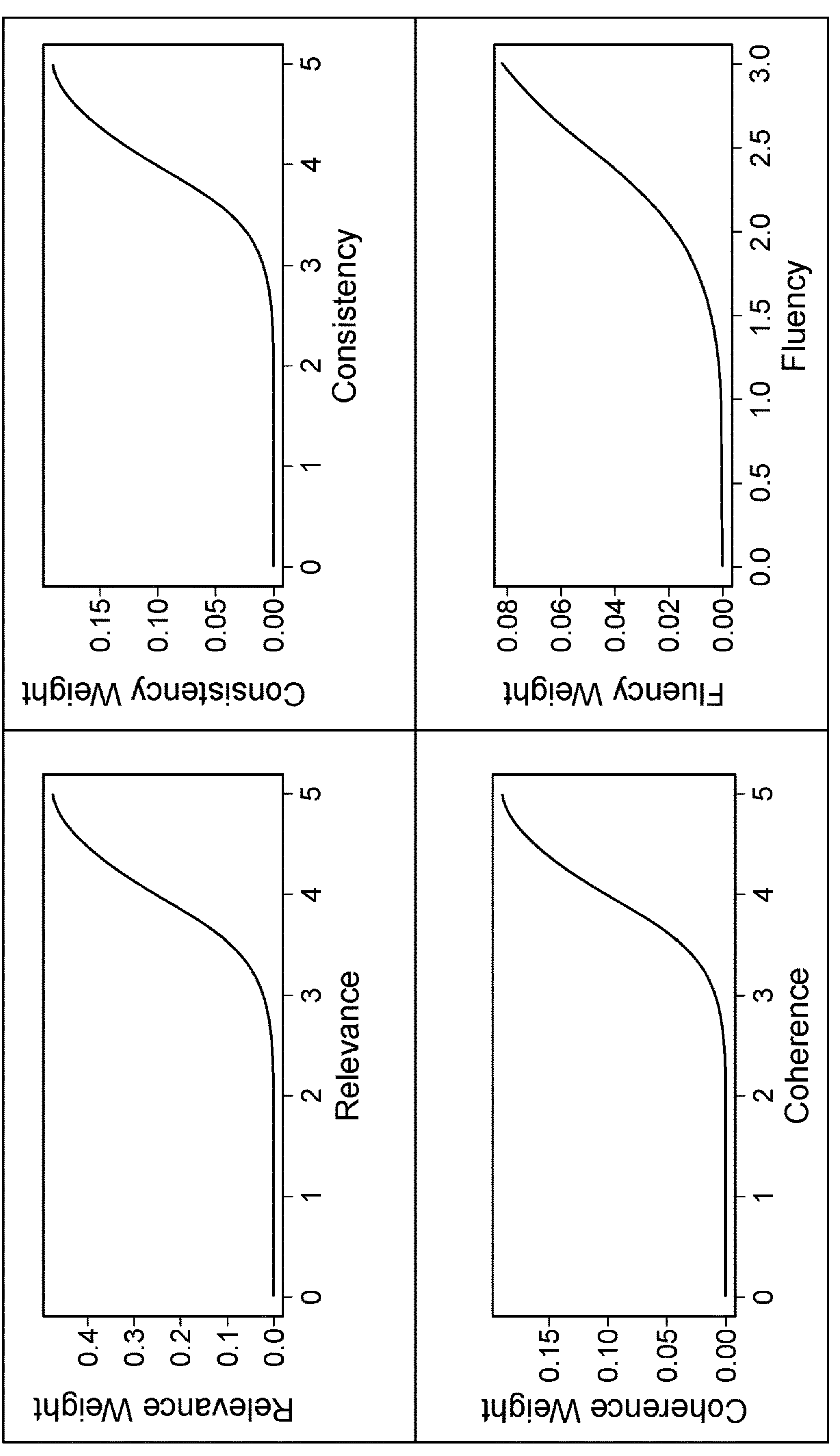
FIG. 4 illustrates corresponding graphs associated with a relevance value, a consistency value, a coherence value, and a fluency value in accordance with some embodiments.

The maximum weights and threshold are constants that are derived from the data through training. As seen in example depicted in FIG. 4, the maximum weights for relevance, consistency, coherence, and fluency are 0.5, 0.2, 0.2, and 0.1, respectively. Similarly, thresholds are established for consistency relevancy, coherency (e.g., 4 for consistency, relevancy, coherence, and 2.5 for fluency). Once the weights are determined, a weighted average of consistency, relevancy, coherency, and fluency is determined. The main idea here is that each score above these thresholds has significantly more importance than weights below the threshold, hence they are weighed significantly higher.

The reference free evaluator score is a sum of the coherence value, relevance value, a consistency value, and a fluency value where each value has a corresponding weight. For example, the reference free evaluator score=$W_R$Relavance+$W_C$Coherence+$W_C$consistency+$W_F$Fluency.

In the second scenario, a resultant score for the LLM response is a harmonic mean of the reference dependent evaluator score and the reference free evaluator score. In other embodiments, other statistical measures of reference dependent evaluator score and the reference free evaluator score are used.

In the third scenario, the reference dependent evaluator score is reassigned to a value of 1 to binarize the score. A resultant score for the LLM response is a harmonic mean of the reference dependent evaluator score and the reference free evaluator score. In other embodiments, other statistical measures of reference dependent evaluator score and the reference free evaluator score are used.

The resultant scores are utilized by query portal 112 to determine whether the LLM has access to quality input data for a received query. A model utilizes these resultant scores to pinpoint missing documents in a data repository and identify new content that needs to be added to improve the response capabilities of LLM 118. By analyzing these resultant scores, the data repository may be enhanced and the overall quality of LLM responses to user queries may be improved.

Figure 2A:
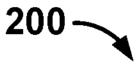
FIG. 2A is a flow diagram illustrating an embodiment of a process to evaluate the performance of an LLM in accordance with some embodiments.
Figure 2A:
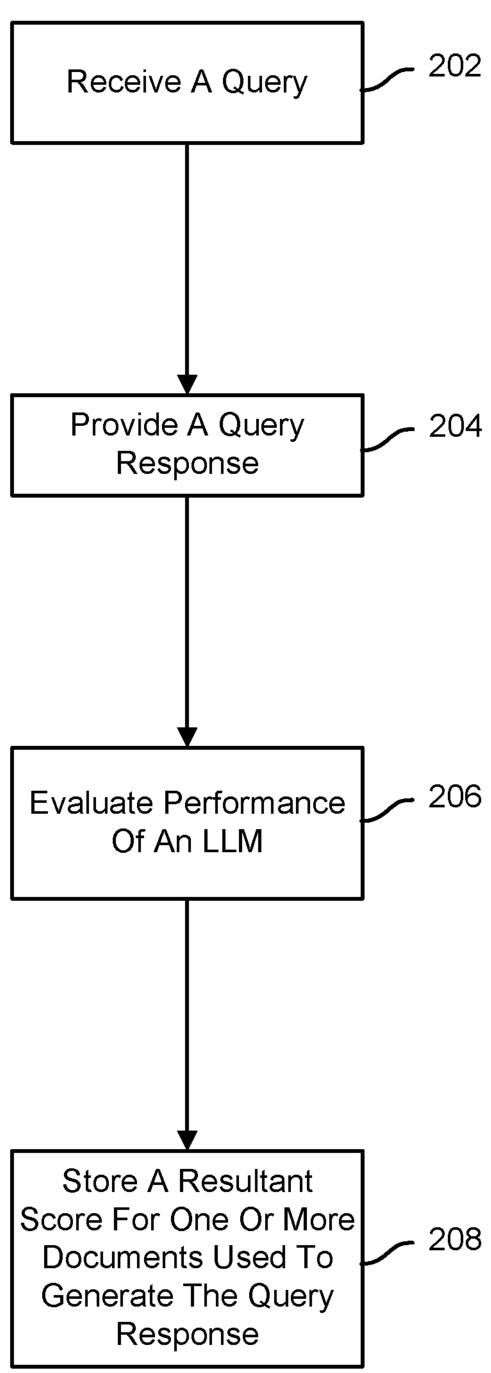

FIG. 2A is a flow diagram illustrating an embodiment of a process to evaluate the performance of an LLM in accordance with some embodiments. Process 200 may be implemented by a query portal, such as query portal 112.

At 202, a query is received from a client device.

At 204, a query response is provided to the client device. The query is provided to an LLM. The LLM may be a private LLM, a public LLM, or a hybrid LLM. In response to receiving the query, the LLM generates the query response.

At 206, a performance of an LLM in generating the query response is evaluated. The LLM is evaluated using a reference dependent evaluator and/or a reference free evaluator. The reference dependent evaluator and the reference free evaluator output a corresponding score.

In some embodiments, the reference dependent evaluator score is less than or equal a first threshold. In such embodiments, the reference free evaluator does not need to compute a value and the reference dependent evaluator score is reassigned to a value of 0. The resultant score for the query response is 0.

In some embodiments, the reference dependent evaluator score is greater than the first threshold and less than or equal to a second threshold. In such embodiments, the reference free evaluator determines a score and a harmonic mean (or other statistical measure) of the reference free evaluator score and the reference dependent evaluator score is determined to be a resultant score for the query response.

In some embodiments, the reference dependent evaluator score is greater than the second threshold. In such embodiments, the reference free evaluator determines a score, the reference dependent evaluator score is reassigned to a value of 1 and a harmonic mean (or other statistical measure) of the reference free evaluator score and the reference dependent evaluator score is determined.

At 208, the resultant score for one or more documents used by the LLM to generate the query response is stored.

Figure 2B:
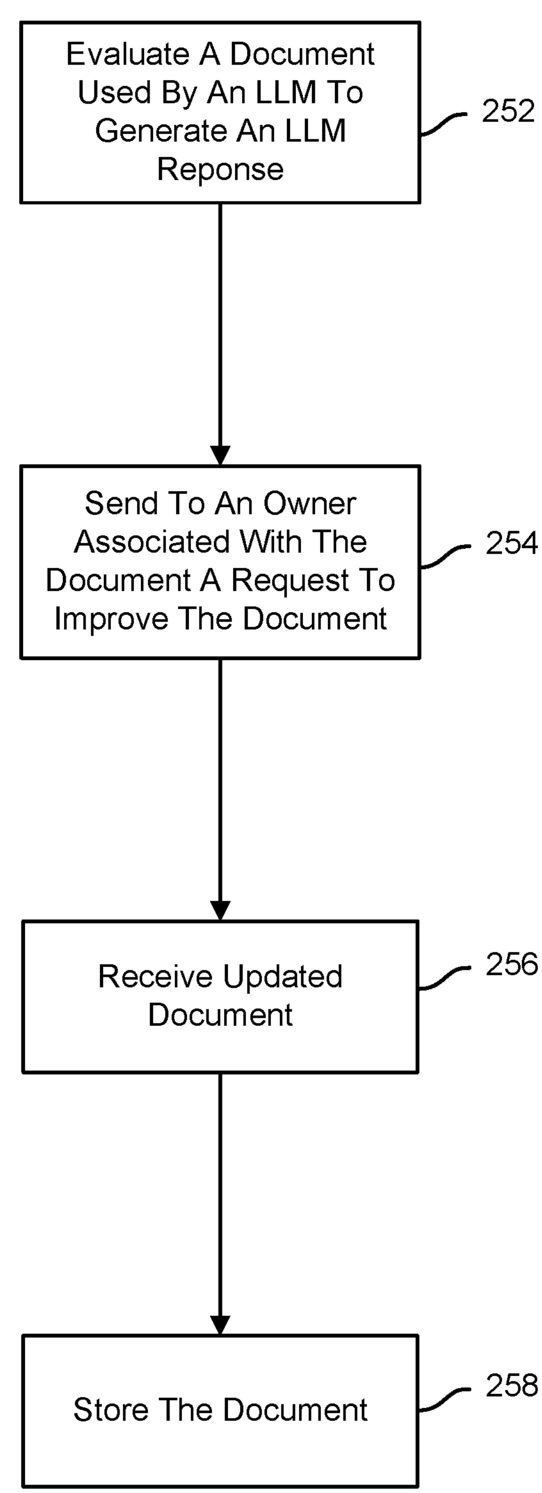
FIG. 2B is a flow diagram illustrating a process to update a document in accordance with some embodiments.

FIG. 2B is a flow diagram illustrating a process to update a document in accordance with some embodiments. In some embodiments, process 250 is implemented by a query portal, such as query portal 112. Process 250 may be performed with respect to a plurality of documents used by an LLM to generate an LLM response. Process 250 may be performed according to a schedule (e.g., daily, weekly, monthly, etc.). Process 250 may be performed in batches (e.g., for a set of documents).

At 252, a document used by an LLM to generate an LLM response is evaluated. The document is associated with a plurality of resultant scores. Each resultant score is associated with a corresponding query. The distribution of resultant scores is analyzed to determine whether the document is providing quality LLM responses. In some embodiments, the distribution of resultant scores is right-skewed. In some embodiments, the distribution of resultant scores is left-skewed. In some embodiments, the distribution of resultant scores is a symmetrical distribution.

Figure 5:
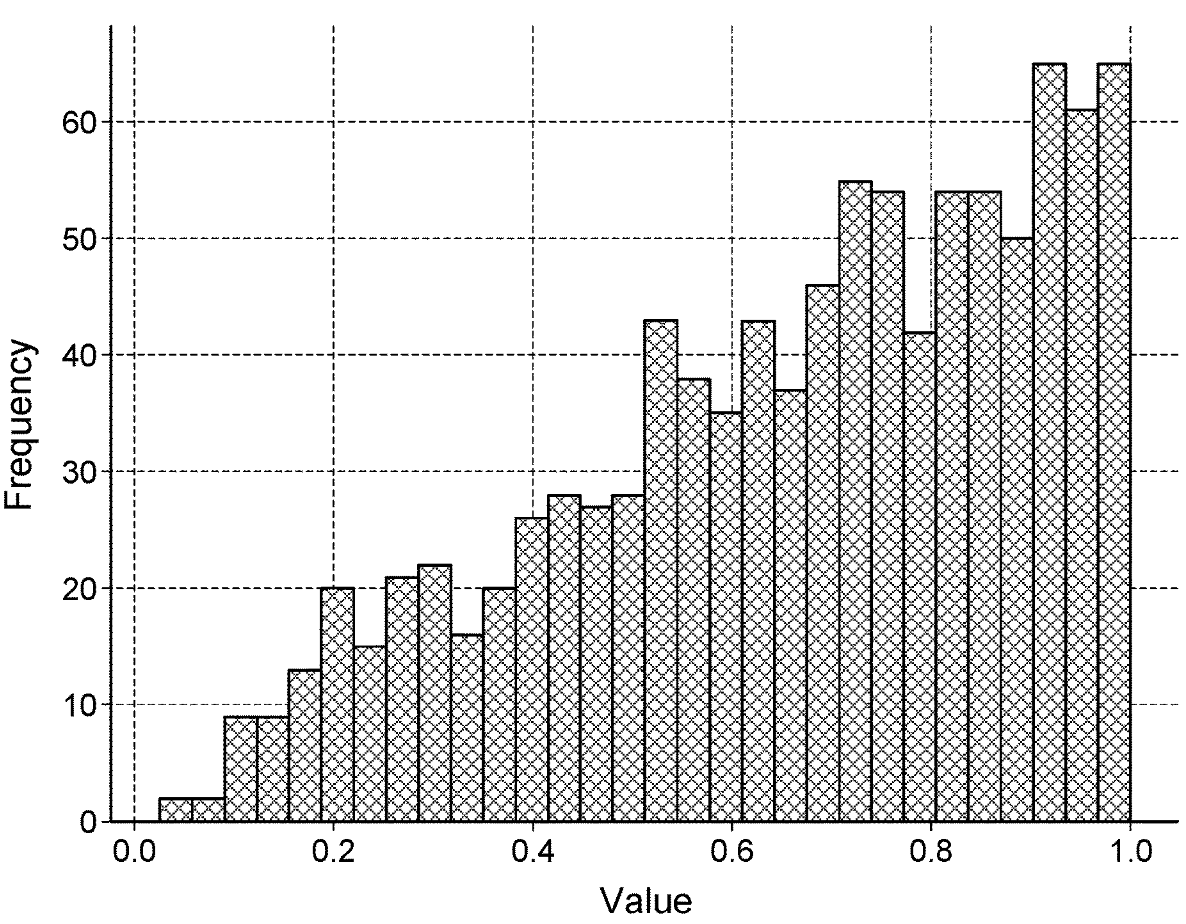
FIG. 5 is an example of a left-skewed resultant score distribution in accordance with some embodiments.

A skewness associated with a resultant score distribution associated with a document indicates which topic information needs to be added to the document to improve the quality of information for RAG-based LLMs. For example, if the topic is "holidays" and the score distribution for "holidays" is right-skewed, this indicates that more information related to the holidays needs to be added to the document to achieve better results from the LLM. If the score distribution is left-skewed, for example as shown in FIG. 5, this indicates that the document includes relevant information to answer queries associated with the top of "holidays."

Whether the distribution of resultant scores associated with a document is too right-skewed may be determined based on a mean, median, or mode associated with the resultant scores. The mean, median, or mode may be compared to a threshold mean, threshold median, or a threshold mode, respectively. The distribution of resultant scores associated with the document may be determined to be too right skewed in the event the corresponding mean, median, or mode is less than or equal to the threshold mean, threshold median, or threshold mode, respectively.

At 254, a request to improve the document is sent to an owner associated with the document.

At 256, an updated document is received from the owner associated with the document. In some embodiments, a new document is received in place of an updated document. The updated document or new document includes the information needed by the LLM to generate a quality response for a plurality of queries.

At 258, the updated document is stored in a corpus of documents available for the LLM to generate an LLM response for a plurality of different queries. As a result, the ability of the LLM to generate quality responses for one or more subsequent queries has improved because the documents utilized by the LLM to generate the LLM response for the one or more subsequent queries include the relevant information needed to generate a quality response.

Figure 3:
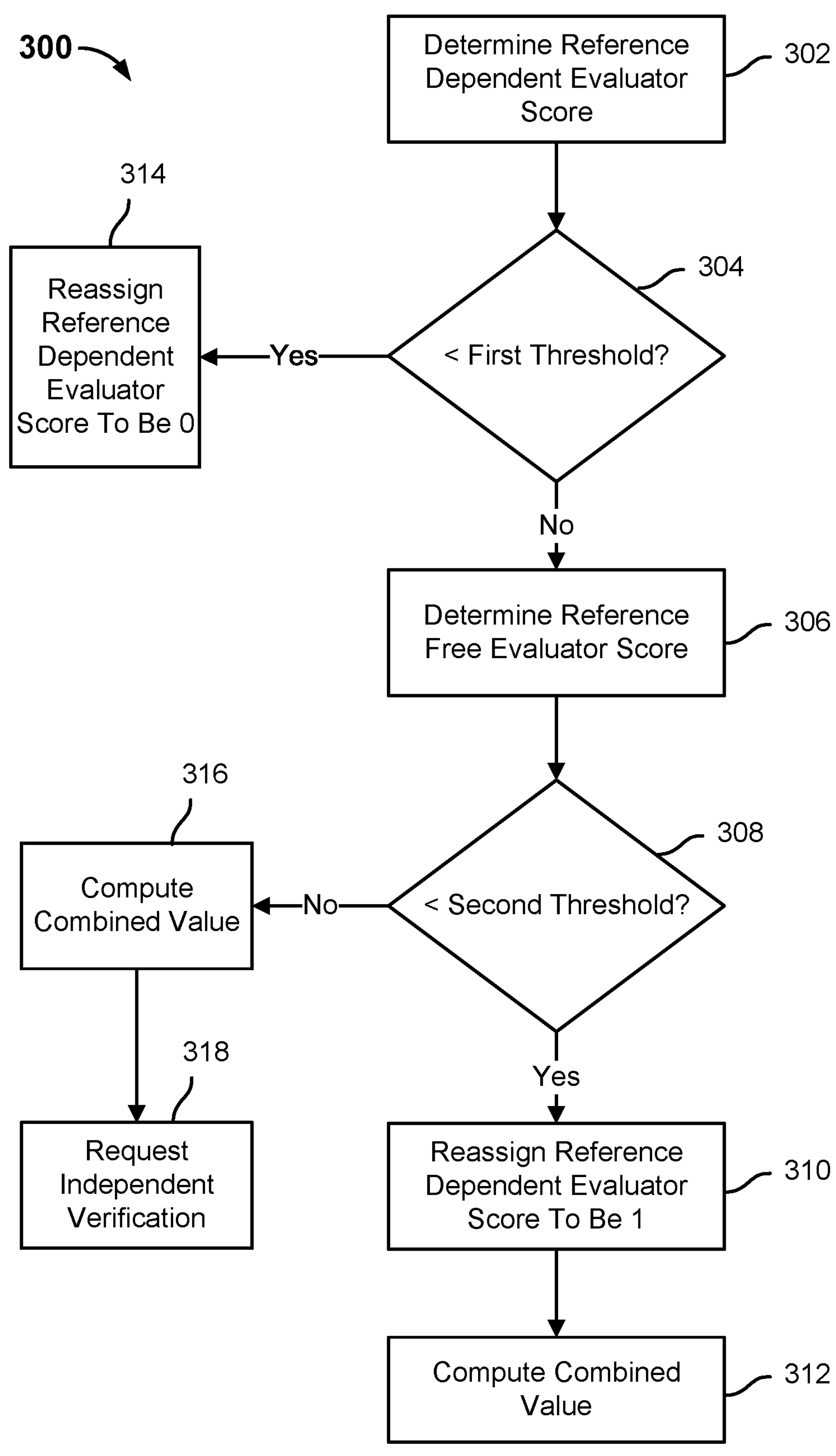
FIG. 3 is a flow diagram illustrating a process to evaluate an LLM.

FIG. 3 is a flow diagram illustrating a process to evaluate an LLM in accordance with some embodiments. In the example shown, process 300 may be implemented by a query portal, such as query portal 112. In some embodiments, process 300 is implemented to perform some or all of step 206 of process 200.

At 302, a reference dependent evaluator score is determined.

At 304, it is determined whether the reference dependent evaluator score is less than a first threshold.

In response to a determination that the reference dependent evaluator score is less than the first threshold, process 300 proceeds to 314. In response to a determination that the reference dependent evaluator score is not less than the first threshold, process 300 proceeds to 306.

At 306, a reference free evaluator score is determined.

At 308, it is determined whether the reference dependent evaluator score is less than a second threshold. In response to a determination that the reference dependent evaluator score is less than the second threshold, process 300 proceeds to 320. In response to a determination that the reference dependent evaluator score is not less than the second threshold, process 300 proceeds to 310.

At 310, the reference dependent evaluator score is assigned a value of 1.

At 312, a combined value of the reference dependent evaluator score and the reference free evaluator score is determined. In some embodiments, a harmonic mean of the reference dependent evaluator score and the reference free evaluator score is determined. In some embodiments, a different statistical value of the reference dependent evaluator score and the reference free evaluator score is determined. The combined value is a resultant score for the query response.

At 314, the reference dependent evaluator score is assigned a value of 0. This is the resultant score for the query response.

At 316, a combined value of the reference dependent evaluator score and the reference free evaluator score is determined. In some embodiments, a harmonic mean of the reference dependent evaluator score and the reference free evaluator score is determined. In some embodiments, a different statistical value of the reference dependent evaluator score and the reference free evaluator score is determined. The combined value is a resultant score for the query response.

At 318, independent verification of the query response is requested from a reviewer. The query response may be flagged in the event the reviewer determines that the query response is not a quality response (e.g., not factually correct, incoherent, includes inconsistent statements, not fluent, etc.). Instead of reviewing and evaluating all LLM responses, human evaluation is needed for only a quarter of the LLM responses, which is a 75% reduction in costs and resources associated with reviewing LLM responses.

Although the foregoing embodiments have been described in some detail for purposes of clarity of understanding, the invention is not limited to the details provided. There are many alternative ways of implementing the invention. The disclosed embodiments are illustrative and not restrictive.

What is claimed is:

1. A method, comprising:

receiving a query;

evaluating a performance of a large language model that generated a query response based on the received query, wherein evaluating the performance of the large language model includes determining a reference dependent evaluator score and/or a reference free evaluator score, wherein the reference free evaluator score is based on a coherence value, a relevance value, a consistency value, and a fluency value, wherein the reference free evaluator score is determined in part by providing a second large language model a prompt that includes a chain of thoughts that will instruct the second large language model on how to grade the query response, wherein the prompt indicates a corresponding range of scores for the coherence value, the relevance value, the consistency value, and the fluency value;

requesting one or more documents used to generate the received query to be updated based on the reference dependent evaluator score associated with the query response;

receiving the one or more updated documents; and storing the one or more updated documents, wherein the one or more updated documents are utilized by the large language model to generate one or more subsequent query responses for one or more subsequent queries.

2. The method of claim 1, wherein the reference dependent evaluator score is determined by comparing a token-by-token embedding of a retrieved context included in the query response to a token embedding of the query.

3. The method of claim 1, wherein the reference dependent evaluator score is a Bidirectional Encoder Representations from Transformers (BERT) score.

4. The method of claim 1, wherein the prompt indicates a scoring function to weigh the coherence value, the relevance value, the consistency value, and the fluency value.

5. The method of claim 4, wherein the reference free evaluator score is a sum of the coherence value, the relevance value, the consistency value, and the fluency value, wherein the coherence value, the relevance value, the consistency value, and the fluency value have a corresponding weight.

6. The method of claim 1, wherein evaluating the performance of the large language model includes comparing the reference dependent evaluator score to a first threshold.

7. The method of claim 6, wherein the first threshold is a 50th percentile of reference dependent evaluator scores.

8. The method of claim 6, wherein evaluating the performance of the large language model includes assigning the query response a resultant score of 0 in response to the reference dependent evaluator score being less than the first threshold.

9. The method of claim 8, wherein the one or more documents are associated with a knowledge document gap in the query response.

10. The method of claim 6, wherein evaluating the performance of the large language model includes determining the reference free evaluator score in response to the reference dependent score being greater than or equal to the first threshold.

11. The method of claim 10, wherein evaluating the performance of the large language model includes comparing the reference dependent evaluator score to a second threshold.

12. The method of claim 11, wherein the second threshold is a 75th percentile of reference dependent evaluator scores.

13. The method of claim 11, wherein the reference dependent evaluator score is assigned a value of 1 in response to the reference dependent evaluator score being greater than the second threshold.

14. The method of claim 13, wherein evaluating the performance of the large language model includes determining a resultant score for the query response based on the reference dependent evaluator score and the reference free evaluator score.

15. The method of claim 11, wherein in response to the reference dependent evaluator score not being greater than the second threshold, evaluating the performance of the large language model further includes:

determining a resultant score for the query response based on the reference dependent evaluator score and the reference free evaluator score; and requesting a reviewer to review the query response.

16. A system, comprising:

a processor configured to:

receive a query;

evaluate a performance of a large language model that generated a query response based on the received query, wherein evaluating the performance of the large language model includes determining a reference dependent evaluator score and/or a reference free evaluator score, wherein the reference free evaluator score is based on a coherence value, a relevance value, a consistency value, and a fluency value, wherein the reference free evaluator score is determined in part by providing a second large language model a prompt that includes a chain of thoughts that will instruct the second large language model on how to grade the query response, wherein the prompt indicates a corresponding range of scores for the coherence value, the relevance value, the consistency value, and the fluency value;

request one or more documents used to generate the received query to be updated based on the reference dependent evaluator score associated with the query response;

receive the one or more updated documents; and store the one or more updated documents, wherein the one or more updated documents are utilized by the large language model to generate one or more subsequent query responses for one or more subsequent queries; and a memory coupled to the processor and configured to provide the processor with instructions.

17. A computer program product embodied in a non-transitory computer readable medium and comprising computer instructions for:

receiving a query;

evaluating a performance of a large language model that generated a query response based on the received query, wherein evaluating the performance of the large language model includes determining a reference dependent evaluator score and/or a reference free evaluator score, wherein the reference free evaluator score is based on a coherence value, a relevance value, a consistency value, and a fluency value, wherein the reference free evaluator score is determined in part by providing a second large language model a prompt that includes a chain of thoughts that will instruct the second large language model on how to grade the query response, wherein the prompt indicates a corresponding range of scores for the coherence value, the relevance value, the consistency value, and the fluency value;

requesting one or more documents used to generate the received query to be updated based on the reference dependent evaluator score associated with the query response;

receiving the one or more updated documents; and storing the one or more updated documents, wherein the one or more updated documents are utilized by the large language model to generate one or more subsequent query responses for one or more subsequent queries.

18. The system of claim 16, wherein the reference dependent evaluator score is determined by comparing a token-by-token embedding of a retrieved context included in the query response to a token embedding of the query.

19. The system of claim 16, wherein to evaluate the performance of the large language model, the processor is configured to compare the reference dependent evaluator score to a first threshold.

20. The system of claim 19, wherein to evaluate the performance of the large language model, the processor is further configured to determine the reference free evaluator score in response to the reference dependent score being greater than or equal to the first threshold.

* * * * *